United States Patent
Sato

(10) Patent No.: US 6,348,698 B1
(45) Date of Patent: Feb. 19, 2002

(54) LAYERED SEMICONDUCTOR STRUCTURES AND LIGHT EMITTING DEVICES INCLUDING THE STRUCTURE

(75) Inventor: Shunichi Sato, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 09/315,829

(22) Filed: May 21, 1999

Related U.S. Application Data

(63) Continuation-in-part of application No. 09/204,292, filed on Dec. 3, 1998.
(51) Int. Cl.$^7$ .................. H01L 29/205; H01L 33/00; H01S 5/00
(52) U.S. Cl. .................. 257/22; 257/13; 257/85; 257/96; 372/45
(58) Field of Search ............... 257/13, 22, 85, 257/96; 372/45

(56) References Cited

U.S. PATENT DOCUMENTS

| | | | | |
|---|---|---|---|---|
| 5,960,018 A | * | 9/1999 | Jewell | 257/15 |
| 6,057,560 A | * | 5/2000 | Uchida | 257/97 |

FOREIGN PATENT DOCUMENTS

| JP | 07263744 | * | 10/1995 | ... | 257/13 |
|---|---|---|---|---|---|

* cited by examiner

Primary Examiner—Jerome Jackson, Jr.
(74) Attorney, Agent, or Firm—Dickstein Shapiro Morin & Oshinsky LLP

(57) ABSTRACT

A light emitting device is provided, which comprises a III-V semiconductor alloy layered structure as an active layer thereof, including N and at least one other group-V element, and at least one group-III element. The light emitting device is in use for red wavelength laser diodes having excellent temperature characteristics, visible wavelength laser diodes which may achieve emissions shorter wavelengths than 600 nm, visible region light emitting diodes having a high intensity, laser diodes for optical communication having excellent temperature characteristics, and similar light emitting devices. The III-V semiconductor alloy layered structure is provided to be used as an active layer for forming the light emitting device, which comprises first and second monatomic layers. The first monatomic layer includes a III-V semiconductor alloy containing N, at least one other group-V element, and at least one group-III element; and the second monatomic layer includes a III-V semiconductor alloy containing no N and at least one group-V element excepting N, and at least one group-III element. Through the deposition of the first and second monatomic layers in a predetermined order, the III-V semiconductor alloy structure is formed as a superlattice structure having a deduced average composition.

16 Claims, 9 Drawing Sheets

$(Al_{0.2}Ga_{0.8})_{0.5}In_{0.5}NP$ $[DMHy]/[DMHy]+[PH_3]=0.10$
$Tg = 700°C$ $Ga_{0.5}In_{0.5}NP$ $[DMHy]/[DMHy]+[PH_3]=0.63$
$Tg = 650°C$

LAYERED SEMICONDUCTOR STRUCTURES AND LIGHT EMITTING DEVICES INCLUDING THE STRUCTURE

This application is a continuation-in-part of U.S. patent application Ser. No. 09/204,292, filed Dec. 3, 1998, the entire disclosure of which is incorporated herein by reference.

BACKGROUND OF THE INVENTION

1. Field of the Invention

This invention relates to layered semiconductor structures and more particularly, to layered III-V semiconductor structures with high nitrogen contents and to light emitting devices including the layered structures for use in laser diodes, photoreceptors and other similar devices.

2. Description of the Related Art

Compound semiconductors in general and AlGaInP semiconductor materials in particular have recently received considerable attention as a group of new semiconductor materials. These materials are well suited for the use of high intensity light sources such as, for example, light emitting diodes for color display devices, which have light emissions ranging from green to red, and semiconductor laser diodes in the visible wavelength region for optical recording and printing systems.

The AlGaInP semiconductor materials have a largest band gap energy among III-V alloy semiconductors of the direct transition type, which are lattice-matched to GaAs. A maximum band gap energy for the materials reaches approximately 2.3 eV or 540 nm in wavelength.

To construct a light emitting device, a heterojunction structure is formed, which basically comprises a narrow band gap active (light emitting) layer joined to a relatively wider bandgap, lattice-matched cladding layer.

When a heterojunction is formed using the AlGaInP materials, a relatively small conduction band discontinuity (ΔEc) results, in general, between the active and cladding layers. This small band discontinuity causes injected carriers (or electrons) to overflow from the active layer to the cladding layer with relative ease, thereby giving rise to disadvantages such as, for example, a large variation of a laser threshold current density with temperature, and unsatisfactory temperature characteristics of the light emitting devices constructed with the materials.

To achieve a satisfactory carrier confinement, thereby overcoming the above-mentioned difficulty, a structure has been disclosed in Japanese Laid-Open Patent Application No. 4-114486 (1992), in which a multi-quantum barrier (MQB) structure is provided between an active layer and a cladding layer, though this results in a more complicated structure.

In order to achieve laser emission, it is essential to attain the confinement of carriers and light beams into an active layer which is sandwiched between cladding layers to form a double heterostructure (DH). Although an active layer material having a relatively large band gap energy is required to achieve laser emissions at shorter visible range wavelengths, the band gap energy for the material can not be too large because of the relative magnitude of band gap energies described just above, as long as the material is used in bulk for forming the DH structure.

As an example, continuous laser emissions at 632.7 nm at room temperature is described using an $(Al_{0.19}Ga_{0.81})_{0.5}In_{0.5}P$ active layer by K. Kobayashi and others, Japanese Journal of Applied Physics, Vol. 29, page L 1669 (1990). Further, to attain laser emissions at shorter wavelengths, a quantum well (QW) structure has been developed. In addition to achieve a low lasing threshold current, a strained QW structure including strained quantum well layers has been proposed in Japanese Laid-Open Patent Application No. 6-77592.

Also, continuous laser emissions at 615 nm at room temperature have been described by H. Hamada, Electronic Letters, Vol. 128, p 1834 (1992). This laser device includes an $(Al_{0.08}Ga_{0.92})_{0.45}In_{0.55}P$ quantum well layer incorporated into compressively strained multi-quantum well active layers combined with multi-quantum well barrier (MQB) structure. The device is of almost no practical use, however, due to its unsatisfactory temperature characteristics.

Furthermore, to fabricate a laser diode on a silicon or GaP substrate, nitrogen-containing III-V alloy semiconductors such as InNSb and AlNSb, are disclosed in Japanese Laid-Open Patent Application No. 7-7223 (1995). In that disclosure, the band gap energies of the two semiconductors, InNSb and AlNSb, are estimated by linearly interpolating band gap energies of InN and InSb, and AlN and AlSb, respectively, to find that Al $N_{0.4}Sb_{0.6}$ is lattice-matched to GaAs, and that has a band gap energy of about 4.0 eV.

If the above alloy semiconductor is feasible, light emitting devices may be fabricated, which have emission wavelengths ranging to the ultraviolet spectral region. However, since almost all of these nitrogen-containing alloy semiconductors are in the non-miscible region in the solid solubility diagram, they are not feasible by conventional crystal growth methods but only by non-equilibrium growth methods such as, for example, metal organic chemical vapor deposition (MOCVD) and molecular beam epitaxy (MBE).

However, even by MOCVD and MBE, the nitrogen content has not been able to exceed 10%, and the content of about 40% which is considered to be preferable to the device application, is quite difficult to achieve. In addition, as disclosed in Japanese Laid-Open Patent Application No. 6-334168 (1994), a relatively large degree of the energy level bowing is present owning to a large electronegativity of nitrogen. Therefore, band gap energies of these materials decrease by adding more nitrogen into InSb or AlSb, and at the alloy composition for which the lattice-matching to GaAs or Si is attained, the band gap energy is smaller than those of InSb or AlSb in contrast with the above expectation.

Accordingly, it is difficult to form an alloy semiconductor such as disclosed in the above Patent Application No. 6-37355. By utilizing the energy band bowing, on the other hands, a light emitting device with 1.5 micron emissions may be achieved With a GaInNAs material formed on a GaAs substrate, as described in Japanese Laid-Open Patent Application No. 6-37355 (1994).

In prior device fabrication methods, the growth of GaInNAs layers having N as a group-V element were carried out by simultaneously supplying each of source materials for Ga, In, N and As to achieve a constant composition throughout the thickness of the alloy layers.

However, in such GaInNAs semiconductor alloy system, the alloy layers are generally grown with a mixing ratio of the third additive element of only a few percent different than the stoichiometric compositions.

In addition, a monatomic superlattice structure has been disclosed in Japanese Laid-Open Patent Application No. 7-263744, to grow a semiconductor alloy having an N content higher than those formed by previous growth techniques. The monatomic superlattice structure in the disclosure comprises a systematically layered structure with a first monatomic layer including one of the group-III elements and one of the group-V elements other than N, and a second monatomic layer including one of the group-III elements and N as the group-V element.

For example, a "unit structure" is first constructed from eight monatomic layers, in which six GaP first monatomic layers and two GaN second monatomic layers are deposited in a predetermined order. Second, by systematically depositing a plurality of the unit structures, a light emitting layer is formed.

This disclosure states that a superlattice structure can be formed having a bandgap energy approximately the same as that of a GaNP mixed crystal, and that mixed crystals of GaNP and similar crystals can be formed having higher N contents, which have not been achieved through prior growth techniques.

Since some of the monatomic layers of III-V semiconductor compound are used including only N as the group-V element in the above disclosure in the Patent Application '744, layered mixed crystal structures may be formed having high N contents and predetermined compositions with an N content of 12.5, 25, 37.5, 50, 62.5, 75 or 75.5 percent.

However, there is a certain range of composition, which may not be achieved by this method. For example, in order to obtain an N content as low as 1%, a structure has to be constructed from 99 monatomic layers without N as the group-V elements and one monatomic layer containing N. This results in a portion of the structure which is composed only of the III-V compound without any of N content over a thickness of approximately 30 nanometers. This results in properties similar to bulk semiconductor materials rather than those of the desired monatomic superlattice structure having a single average composition. Therefore, the above-mentioned method is not satisfactory for growing semiconductor alloys having an arbitrary elemental composition.

SUMMARY OF THE INVENTION

Accordingly, it is an object of the present invention to provide a layered structure of a III-V semiconductor alloy including N and at least one of the other group-V elements and a plurality of the group-III elements, capable of having a deduced average composition which has been difficult to achieve by the previous growth method, and having both a conduction band offset ΔEc and a valence band offset ΔEv large enough for the practical applications to light emitting devices such as laser diodes, for example.

It is another object of the invention to provide a layered structure of a III-V semiconductor alloy including N and at least one of the other group-V elements and a plurality of the group-III elements, capable of providing light emitting devices such as red wavelength laser diodes with excellent temperature characteristics, visible wavelength laser diodes which may achieve emissions shorter wavelengths than 600 nm, and visible region light emitting diodes having a high intensity.

According to one aspect of the invention, the III-V semiconductor alloy layered structure comprises first and second monatomic layers, in which the first monatomic layer including a III-V semiconductor alloy containing N, at least one other group-V element, and at least one group-III element; and the second monatomic layer includes a III-V semiconductor alloy containing no N and at least one group-V element excepting N, and at least one group-III element. Through the deposition of the first and second monatomic layers in a predetermined order, the III-V semiconductor alloy structure is formed as a superlattice structure having a deduced average composition.

According to another aspect of the invention, the III-V semiconductor alloy structure is formed with first and second monatomic layers so as to have a reduced composition of $Ga_xIn_{1-x}N_yAs_{1-y}$, where $0<x<1$ and $0<y<1$.

The first monatomic layer has an N content and a composition of $Ga_{x1}In_{1-x1}N_yAs_{1-y}$, where $0<x1\leq1$ and $0<y<1$, and second monatomic layer has no N content and has a composition of $Ga_{x2}In_{1-x2}As$, where $0\leq x2<x1\leq1$, respectively. In addition, at least one each of the first and second monatomic layers is deposited in a predetermined order to form the III-V semiconductor alloy structure as a superlattice structure.

According to another aspect of the invention, the III-V semiconductor alloy structure is formed with first and second monatomic layers so as to have a reduced composition of $(Al_xGa_{1-x})_yIn_{1-y}N_zP_{1-z}$, where $0<x\leq1$, $0<y\leq1$ and $0<z<1$.

The first monatomic layer has an N content, no Al content and a composition of $Ga_yIn_{1-y}N_zP_{1-z}$, where $0\leq y\leq1$ and $0<z<1$, and second monatomic layer has no N content, an Al content and a composition of $(Al_xGa_{1-x})_yIn_{1-y}P$, where $0<x\leq1$ and $0<y\leq1$, respectively. In addition, at least one each of the first and second monatomic layers is deposited in a predetermined order to form the III-V semiconductor alloy structure as a superlattice structure.

According to another aspect of the invention, the III-V semiconductor alloy structure is formed with a monatomic layer which has neither N nor Al content and a composition of $Ga_yIn_{1-y}P$ ($0\leq y\leq1$), is interposed between first and second monatomic layers.

The first monatomic layer has an N content and a composition of $Ga_yIn_{1-y}N_zP_{1-z}$ ($0\leq y\leq1$ and $0<z<1$) and the second monatomic layer has no N content, an Al content and a composition of $(Al_xGa_{1-x})_yIn_{1-y}P$ ($0<x\leq1$ and $0<y\leq1$).

According to another aspect of the invention, light emitting devices are constructed, incorporating the III-V semiconductor alloy structure as an active layer, in which the III-V semiconductor alloy structure is as specified in the above embodiment 1, 2, 3 or 4.

DESCRIPTION OF THE ILLUSTRATIVE EMBODIMENTS

Figure 1:
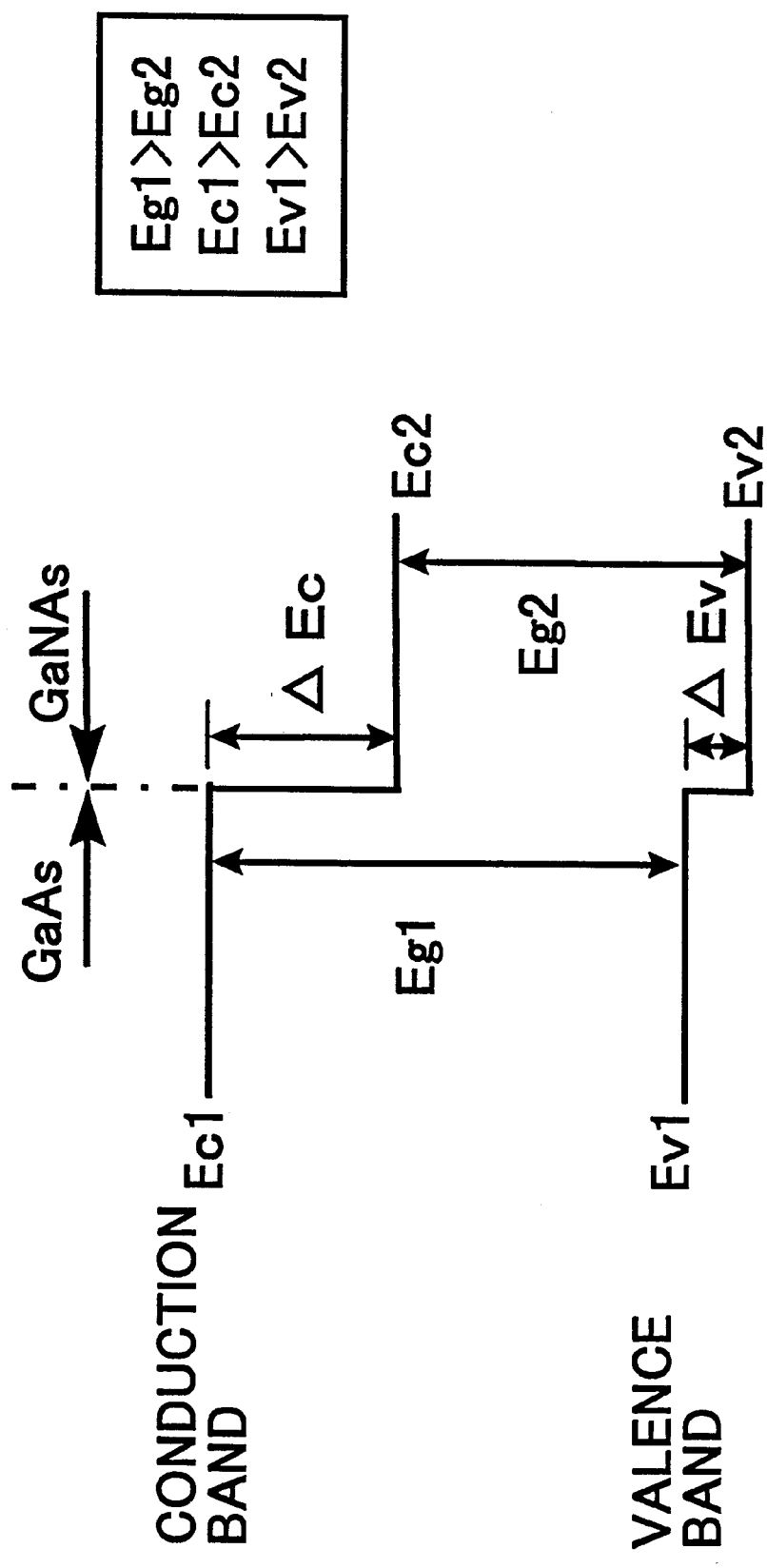
FIG. 1 illustrates an energy band alignment of a heterostructure which is formed with two alloy semiconductors, one is GaAs and the other is GaNAs.

In the description which follows, specific embodiments of the invention particularly useful in light emitting device applications are described. It is understood, however, that the invention is not limited to these embodiments. For example, it is appreciated that layered structures in this invention are adaptable to any form of semiconductor devices. Other embodiments will be apparent to those skilled in the art.

Among the compound semiconductors, GaInPAs materials which are grown on an InP substrate have been used for fabricating laser diodes having light emissions at relatively long wavelengths such as 1.3 Mm or 1.5 Mm. When a heterojunction is formed with this material, however, a relatively small conduction band discontinuity or heterojunction barrier ($\Delta Ec$) results between an active and a cladding layer. This small band discontinuity causes injected carriers (or electrons) to overflow from the active layer to the cladding layer with relative ease, thereby giving rise to disadvantages such as, for example, a large variation of a laser threshold current density with temperature, or unsatisfactory temperature characteristics of the light emitting devices fabricated with the materials.

On the other hand, GaInNAs semiconductor materials are capable of being lattice-matched to GAS and having a band gap energy suitable for long wavelength emissions. In addition, the GaInNAs materials can be interfaced by an cladding layer comprising AlGaAs or GaInP materials which have a band gap energy larger than that of the GaInNAs materials. This facilitates the formation of a hetero-junction which has relatively large hetero-barriers ($\Delta Ec$ and $\Delta Ev$), and also the improvement of temperature characteristics of laser devices fabricated with the materials.

However, the growth of the above-mentioned compound semiconductors which include nitrogen (N) as a group-V element are known to be quite difficult. In the solid solubility diagram, almost all nitrogen-containing semiconductors are in the non-miscible region. The growth of these alloy semiconductors are therefore generally difficult when prior crystal growth methods are used. Only a minute amount of nitrogen can be incorporated in semiconductor crystals using non-equilibrium growth methods as such as, for example, metal organic chemical vapor deposition (MOCVD) and molecular beam epitaxy (MBE).

For alloy semiconductors, in general, the non-miscibility increases with an increase in the number of constituent elements, and also toward the middle of the elemental composition. In other words, binary alloys can be grown most easily. This is also true for alloy semiconductors containing nitrogen as a group-V element.

Therefore, semiconductor alloys having an elemental composition closer to GaNAs can be grown with more ease within a GaInNAs alloy system. This is evidence by the results of N contents shown in Table 1 for the GaInNAs layers which were grown on a GaAs substrate having varying In content percentages. These results on the N content were obtained from secondary ion mass spectroscopy (SIMS) measurements.

TABLE 1

| In content (%) | N content (%) |
|---|---|
| 7 | 2.5 |
| 13 | 1.7 |
| 23 | 0.5 |
| 28 | 0.3 |

The GaInNAs alloy layers were grown by MOCVD, in which the source materials were trimethylgallium (TMG), trimethylindium (TMI), arsine ($AsH_3$), and dimethylhydrazine (DMHy), and hydrogen was used as a carrier gas. During the layer growth, the substrate temperature was at 630 C, and only the feeding rate of trimethylindium as the In source was varied.

The results in Table 1 indicates that the N content decreases with an increase in the In content. The N content in the GaInNAs alloy layers, which is necessary to bring about a certain emission wavelength, can therefore be decreased by the addition of In. Namely, it is indicates from the results that there exist a certain range of the layer composition which is difficult to achieve by the MOCVD growth method.

Referring to FIG. 1, an energy band alignment of a heterostructure is shown which is formed with two alloy semiconductors, one is GaAs and the other is GaNAs which is GaAs added with nitrogen.

It is described by tKondow, Oyo Buturi, Vol. 65, pages 148–151 (1996), that the band gap energy decreases by adding several percents of N into a III-V alloy semiconductor such as GaAs. This is exemplified by the relationship $E_{g1} > E_{g2}$ in FIG. 1, where $E_{g1}$ and $E_{g2}$ are band gap energies of the semiconductor before and after the nitrogen addition, respectively. FIG. 1 also shows that conduction band and valence band energies decrease by the addition of N.

Namely, in a heterostructure including a GaAs cladding layer and a GaNAs active layer, the valence band energy of the active layer is lower than that of the cladding layer. Therefore, hole carriers can not be confined into the active layer, indicating that the structure is not suitable for light emitting devices.

However, it is noted that a large conduction band discontinuity ($\Delta Ec$) arises in this structure. This may suggest that the confinement of even hole carriers becomes feasible by appropriately selecting materials and composition, for the active layer and cladding layer.

The present inventor has investigated the energy band alignment for AlGaInP materials which can be used for forming visible wavelength lasers. Through this investigation, it is intended that the AlGaInP materials may be found to have hetero-barriers ($\Delta Ec$ and $\Delta Ev$) large enough for satisfactory laser operations, and that light emitting devices become feasible such as red wavelength laser diodes with excellent temperature characteristics, visible wavelength laser diodes which may achieve emissions shorter wavelengths than 600 nm, and visible region light emitting diodes having a high luminosity.

Since the N addition decreases the band gap energy, as described earlier, the N addition may preferably be carried out for materials having a relative large band gap energy to achieve desirable laser characteristics.

Figure 2:
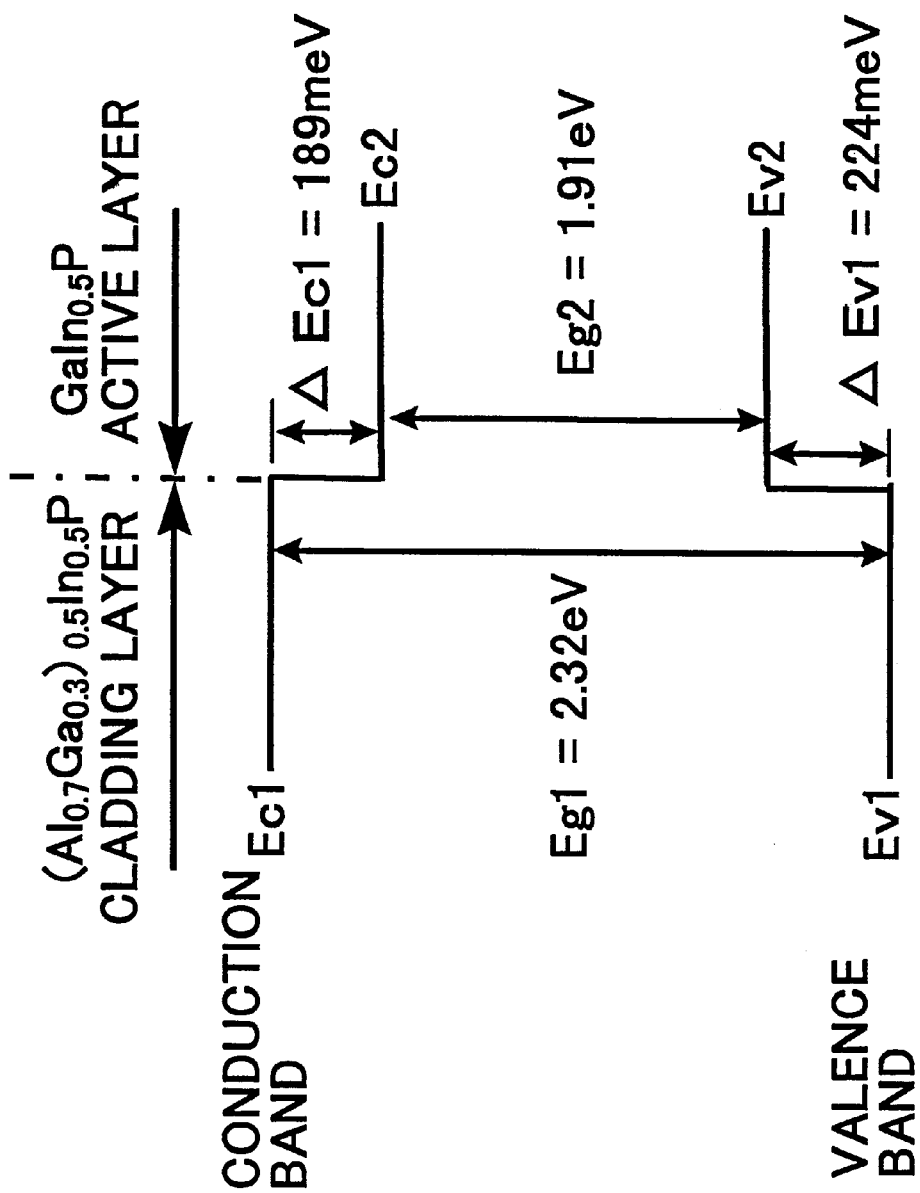
FIGS. 2 and 3 illustrate energy band alignments of alloy materials for forming a short wavelength visible laser device according to a prior material and the material of the present embodiment, respectively.
Figure 3:
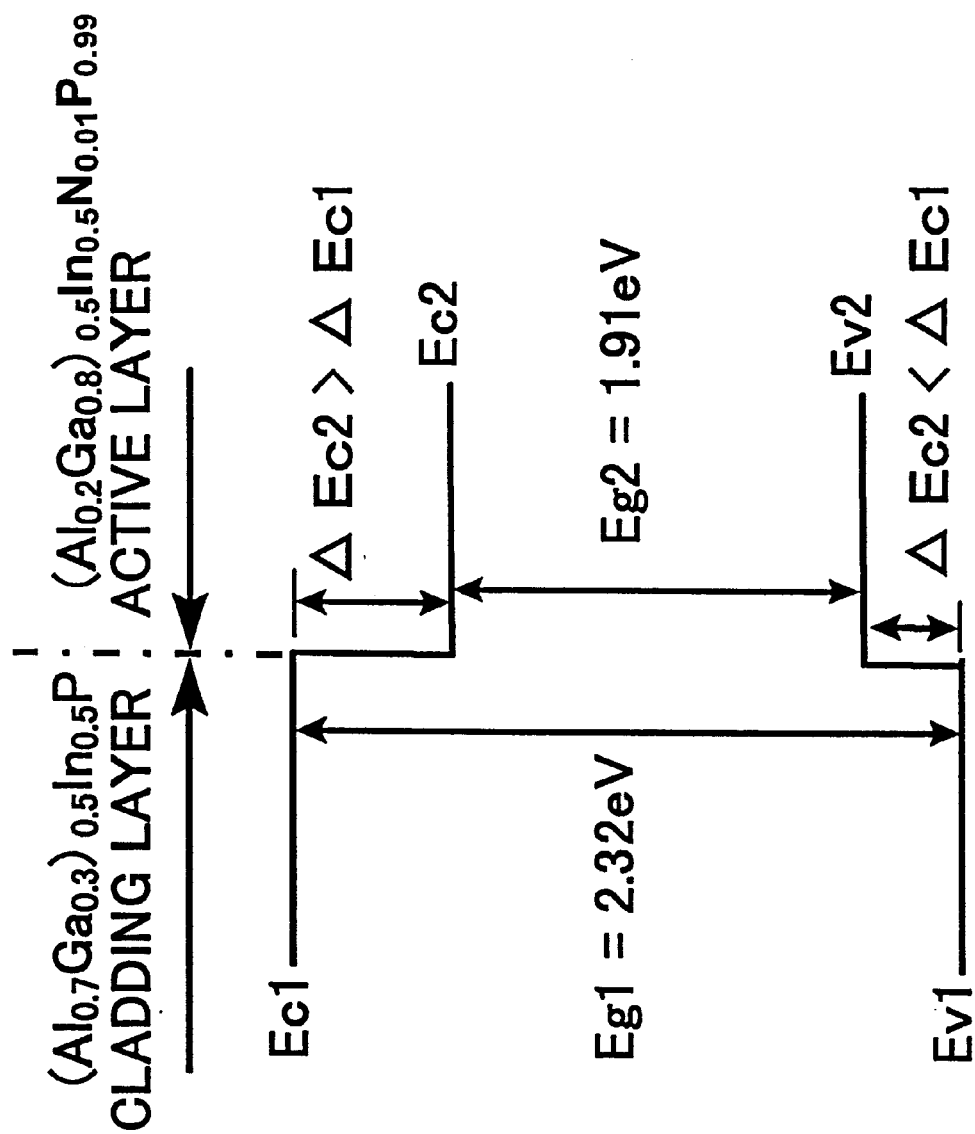

FIGS. 2 and 3 illustrate energy band alignments of alloy materials for forming a short wavelength laser device according to a prior material and the material of present embodiment, respectively.

A GaInP active layer shown in FIG. 2 has light emissions at 650 nm, for example. By comparison, the energy band alignment is shown in FIG. 3 for an alloy material of the present embodiment, in which N is added to AlGaInP so as to obtain the approximately same band gap energy, to thereby have light emissions at the approximately same wavelength as that of the prior GaInP active layer. It is noticed in FIG. 3 that a larger conduction band discontinuity $\Delta Ec$ is obtained for the alloy material of the present embodiment.

With this band offset ($\Delta Ec$), the aforementioned overflow of injected carriers from the active layer to the cladding layer can be prevented, thereby resulting in a decrease in, for example, the variation of a laser threshold current density with temperature.

Despite the advantage mentioned just above, the present inventor has found during the experimentation a considerable decrease in crystallinity of the AlGaInP material caused by the N addition. For AlGaInP material having an Al content of 0.1, for example, a rough crystal surface has been observed after the addition of a minute amount of N, such as a few percent, for example. This decrease in crystallinity is known to increase the probability of the non-radiative recombination of carriers and threshold current densities for the light emission.

Therefore, it is difficult to achieve a high luminosity with a light emitting device including the AlGaInNP material as the active layer.

Figure 4:
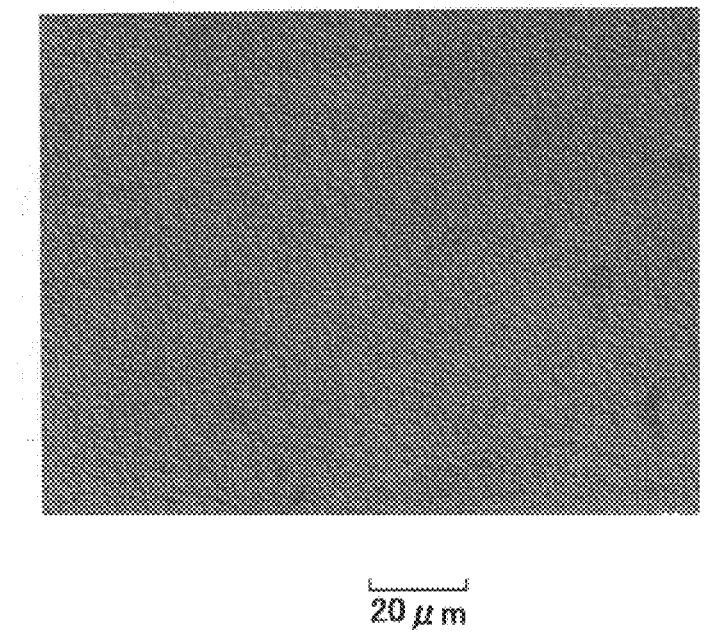
FIGS. 4 and 5 are microscopic photographs and legends of the surfaces of layers AlGaInNP and GaInNP, respectively, each grown on a GaAs substrate by MOCVD and having a thickness of approximately 0.8 micron.
Figure 5:
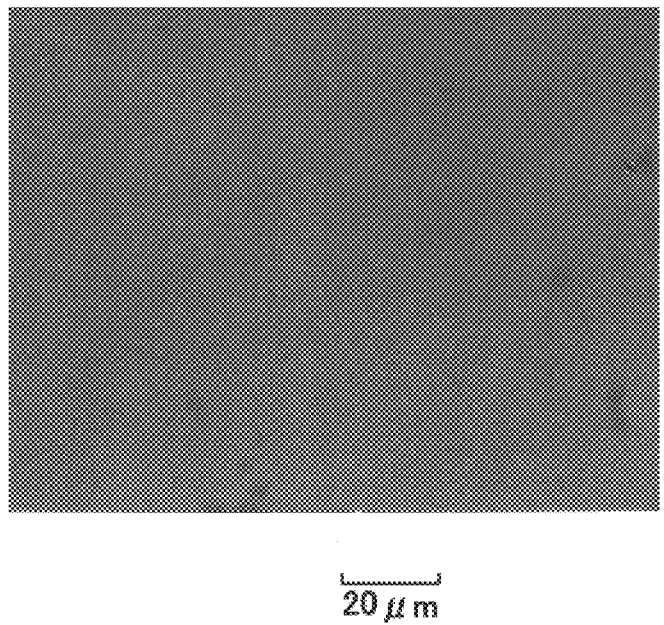

By contrast, the present inventor has also found that the decrease in crystallinity by the N addition is much reduced for the GaInP material compared with the above AlGaInNP material. FIGS. 4 and 5 include microscopic photographs of the surfaces of layers AlGaInNP and GaInNP, respectively, each grown on a GaAs substrate by MOCVD and having a thickness of approximately 0.8 micron. The GaAs substrate for the layer growth was prepared so that the direction normal to the (100) plane is at an angle of 15° toward the [0111] direction. In addition, source materials were trimethylgallium (TMG), trimethylindium (TMI), phosphine ($PH_3$), arsine ($AsH_3$) and dimethylhydrazine (DMHy), and hydrogen was a carrier gas.

In addition, the AlGaInNP and GaInNP layers were each added with N so as to be lattice-matched to the substrate. This results in the compositions for these layers to be $Al_{0.1}Ga_{0.4}In_{0.5}N_{z2}P_{1-z2}$ and $Ga_{0.5}In_{0.5}N_{z1}P_{1-z1}$, respectively. It may be emphasized in this context that the growth of GaInNP was carried out under the conditions such as, a ratio of the source material flow rate for N vs. the group-V element, or [DMHyl]/([$PH_3$]+[DMHy]), and a growth temperature.

Namely, during the layer growth, the above ratio for GaInNP layers was adjusted to be 0.63, which was greater than 0.01 for AlGaInNP. Also, the growth is temperature for GaInNP was 650° C., which was lower than 700° C. for AlGaInNP.

Since the N inclusion is known to be increased with a decrease in growth temperature and an increase in the ratio mentioned just above, the degree of the N inclusion may be considered much greater for the GaInNP layers than the AlGaInNP layers. In addition, it is also known crystallinity is generally decreased with an increase in the amount of the N included. Therefore, is may be considered that the above growth conditions are favorable to the occurrence of a rough surface more on the GaInNP layers than the AlGaInNP layers. However, through the present investigation, it has been found that the GaInNP layers have mirror finished surfaces, although the AlGaInNP layers have developed rough surfaces.

Further, an increase in photoluminescence peak wavelength with the N addition has been successfully observed for the GaInNP layers. Specifically, photo luminescence observed at room temperature exhibits a peak wavelength longer by 30 nm than that of without any N addition. This, in turn, is indicative of the decrease in the band gap energy. In addition, the N concentration has been found as $1.1 \times 10^{20}$ ($cm^3$) or an N content to the group-V element of 0.5%. In addition, no appreciable photoluminescence intensity was observed for the AlGaInNP layers.

The reasons for the decrease in crystallinity of AlGaInNP layers is considered primarily due to its five-compositional system, since the aforementioned non-miscibility increases with an increase in the number of compositional elements for alloy semiconductors. Furthermore, a relatively strong chemical activity of Al which tends to develop a three dimensional structure is considered as an additional reason.

The efficiency of the light emission for the AlGaInP alloy system is known relatively low due to deep levels formed by included Al. In addition, since the N addition tends to decrease crystallinity, the formation of AlGaInP crystals of satisfactory quality is therefore quite difficult. This also affects adversely to the efficient light emission.

By contrast, the GaInNP alloy system is advantageous in principle as well, in that this system is of quaternary compared with the above-mentioned five compositional AlGaInNP layers. The crystal growth of better quality can thus be expected for the GaInNP system. In addition, without any Al, more efficient light emission and the crystal growth of excellent quality even after the N addition, can be expected.

It may be noted that there are contradictory requirements in this context as follows. Since the N addition decreases the band gap energy as aforementioned, Al has to be added to maintain the approximately same wavelength of the light emissions and also to obtain the approximately same lattice constant necessary for fulfilling the lattice-matching condition. The formation of AlGaInNP through the Al addition is thus difficult from the light emission efficiency point of view as well.

Further, through the investigation by the present inventor, it has been found that it is preferable to improve crystallinity of GaInNP layers by interposing a GaInP layer which include neither N nor Al therein, between the AlGaInP and GaInNP layers, rather than growing GaInNP layers directly on top of AlGaInP layers.

Figure 6:
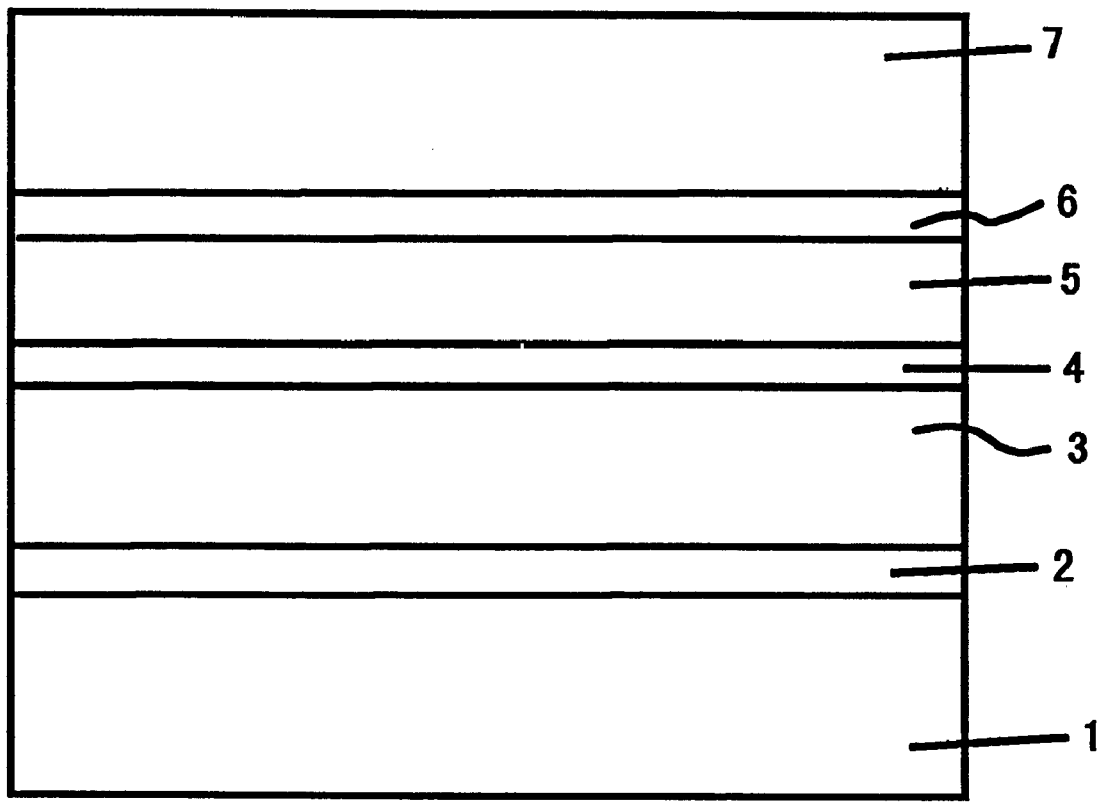
FIG. 6 is a cross section of an SQW structure grown on a GaAs substrate epitaxially by MOCVD.

In fact, the inventor has grown an SQW (single quantum well) structure on a GaAs substrate epitaxially by MOCVD. Referring to FIG. 6, the SQW structure comprises an n-GaAs substrate 1 with the following contiguous layers grown thereon, in the order recited:

An undoped GaAs buffer layer 2 having a thickness of 0.2 micron, an undoped AlGaInP barrier layer 3 having a thickness of 0.2 micron, an undoped GaInP intermediate layer 4 having a thickness of 1.2 nanometer, an undoped GaInNP active layer 5 having a thickness of 35 nanometers, an undoped GaInP intermediate layer 6 having a thickness of 1.2 nanometer, and an undoped AlGaInP barrier layer 7 having a thickness of 50 nanometers.

The thickness of the GaInP intermediate layers 4, 6 are approximately 4 times atomic layer thickness, which is much thinner than that of the active layer 5.

The GaAs substrate 1 for the growth was prepared so that the direction normal to the (100) plane is at an angle of 150° toward the [011] direction. In addition, source materials used were TMG, TMI, PH$_3$, AsH$_3$ and DMHy, and hydrogen was a carrier gas.

Furthermore, the barrier layers 3,7 were prepared with ALGaInP layers which were formed to have such a composition as to be lattice-matched to the substrate 1. In addition, the intermediate layers 4,6 were prepared with GaInP layers which were formed to have a composition so as to be tensively strained by 1% against the substrate 1, and the active layer GaInNP active layer 5 were prepared in a similar manner to the above intermediate layers 4,6.

Figure 7:
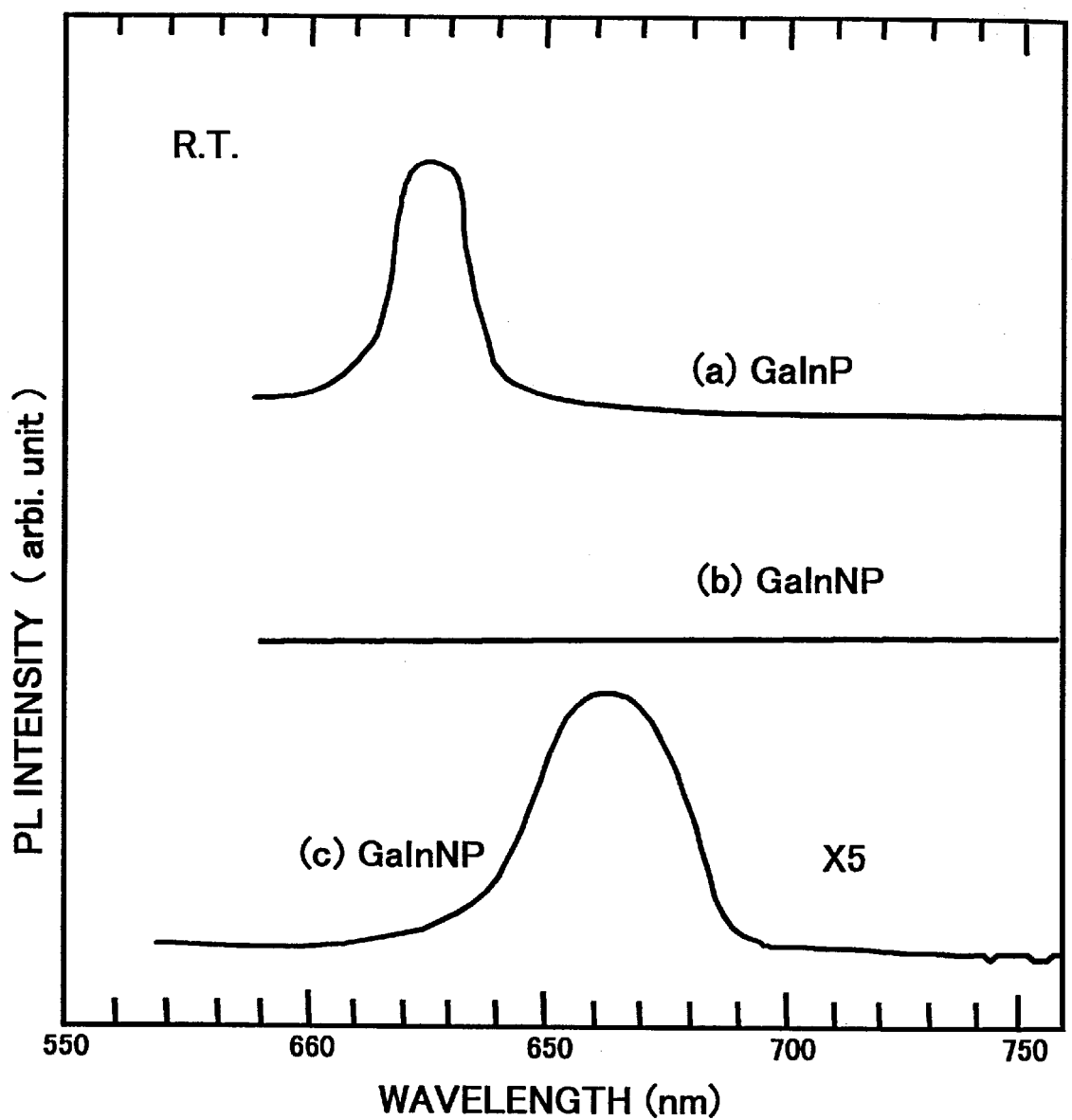
FIG. 7 includes photoluminescence curves for the layered structure disclosed herein, where the curve (c) is for the layered structure of FIG. 6, and the curves (b) and (a) are for the structure of FIG. 6 without being provided with the intermediate layers, and for the structure of FIG. 6 without N addition to the active layer, respectively.

Results from photoluminescence measurements are included in FIG. 7. The photoluminescence curve (c) in FIG. 7 was obtained for the layered structure of FIG. 6. Likewise, the curves (b) and (a) were obtained, respectively, for the structure of FIG. 6 without being provided with the intermediate layers 4,6 and for the structure of FIG. 6 without N addition to the active layer 5. As also shown in FIG. 7, the photo-luminescence curve (c) for the layer without N addition has a peak wavelength at 665 nm. This is compared with the curve (a) having a peak wavelength at 626 nm. This change toward the longer wavelength by 39 nm is considered to be indicative of the decrease in the band gap energy.

For the above-mentioned structure without the intermediate layers 4 and 6, on the other hand, the photo luminescence intensity was considerably decreased as shown by curve (b). This is considered to be due to Al included in the layer. Specifically, the inclusion of Al at the interface of the hetero-junction affects its crystallinity, and further affects the crystallinity of the GaInNP active layer and overlying layers. Further, since the N containing GaInNP alloy system is originally in a rather strong non-miscible region in the solid solubility diagram, as aforementioned, together with a relatively strong activity of Al which tends to develop a three dimensional structure. These are considered to have caused the above-mentioned decrease in crystallinity of the above layers.

It was found from the present investigation that these problems can be obviated by, separating AlGaInP guide (or cladding, barrier) layer 3, 7 and GaInNP active layer 5, with appropriately selected, interposed III-V semiconductor layer structures which include neither N nor Al therein, as exemplified by GaInP intermediate layer 4, 6, in the present case.

Accordingly, the III-V semiconductor alloy structure disclosed herein is provided, which comprises first and second monatomic layers, in which the first monatomic layer includes a III-V semiconductor alloy containing N, at least one other group-V element, and at least one group-III element; and the second monatomic layer includes a III-V semiconductor alloy containing no N and at least one group-V element excepting N, and at least one group-III element, having a different content of the group-III element from the first monatomic layer. Through the deposition of the first and second monatomic layers in a predetermined order, the III-V semiconductor alloy structure is formed as a superlattice structure having a deduced average composition.

Specifically, since the superlattice structure is formed width a plurality of III-V semiconductor layers and these constituent layers are each formed as thin monatomic layers, the resultant superlattice structure may be considered to be a single semiconductor layer, having a deduced average composition, resulting in the same band gap energy as that of the compound semiconductor having the same composition.

In addition, since the N addition is carried out to the layers for which the N addition can be made with more case, and these layers are disposed in a predetermined order with layers which have no N content, a resultant layered structure becomes feasible to have a higher elemental composition which has been difficult to achieve by the previous growth method that generally grow layers having a single composition throughout the layer growth.

To be more specific, in one embodiment disclosed herein, the above III-V semiconductor alloy structure is formed with first and second monatomic layers so as to have a reduced composition of $Ga_xIn_{1-x}N_yAs_{1-y}$, where 0<x<1 and 0<y<1.

The first monatomic layer has an N content and a composition of $Ga_{x1}In_{1-x}N_yAs_{1-y}$, where 0<x1≦1 and 0<y<1, and second monatomic layer has no N content and has a composition of $Ga_{x2}In_{1-x2}As$, where 0x2<x1<1, respectively. In addition, at least one each of the first and second monatomic layers is deposited in a predetermined order to form the III-V semiconductor alloy structure as a superlattice structure.

Since the superlattice structure of this embodiment is formed with a plurality of III-V semiconductor layers and these constituent layers are each formed as thin monatomic layers, the resultant superlattice structure may be considered to be a single layer, having the deduced average composition $Ga_xIn_{1-x}N_yAs_{1-y}$. This results in the same band gap energy as that of the compound semiconductor having the same composition.

In addition, since the N addition is carried out to the layers which have no or minimal In content and can include N with more ease, the resultant layered structure can be formed with a higher N content, which has been difficult to achieve by the previous growth method that generally grow layers having a single composition of a group-III element such as In, for example, throughout the layer growth. Therefore, the overall efficiency of the N inclusion is increased, facilitating the formation of GaInNAs layers having an excellent crystallinity.

In another embodiment disclosed herein, the above III-V semiconductor alloy structure is formed with first and second monatomic layers so as to have a reduced composition of $(Al_xGa_{1-x})_yIn_{1-y}N_zP_{1-x}$, where 0<x≦1, 0<y≦1 and 0<z<1.

The first monatomic layer has an N content, no Al content and a composition of $Ga_yIn_{1-y}N_zP_{1-z}$, where 0≦y≦1 and 0<z<1, and second monatomic layer has no N content, an Al content and a composition of $(Al_xGa_{1-x})_yIn_{1-y}P$, where 0<x≦1, and 0<y≦1, respectively. In addition, at least one each of the first and second monatomic layers is deposited in a predetermined order to form the III-V semiconductor alloy structure as a superlattice structure.

In this embodiment, the first monatomic layers $Ga_yIn_{1-y}N_zP_{1-z}$, (0≦y≦1 and 0<z<1) are able to include N with more ease, and the second monatomic layers $(Al_xGa_{1-x})_yIn_{1-y}P$ (0<x≦1 and 0<y≦1) have no N content and an Al content, which may impart a wide band gap energy. These first and second monatomic layers are disposed in a predetermined order so as to have the superlattice structure having the reduced composition $(Al_xGa_{1-x})_yIn_{1-y}N_zP_{1-z}$ (0<x≦1, 0<y≦1 and 0<z<1).

With this structure, a larger conduction band discontinuity (ΔEc) by addition of N to $Ga_yIn_{1-y}N_zP_{1-z}$, (0≦y≦1 and $0<z<1$) is attained and the decrease in the band gap energy caused by the N addition is compensated with the Al containing $(Al_xGa_{1-x})_yIn_{1-y}P$ ($0<x\leq1$ and $0<y\leq1$) layers.

This makes an alloy semiconductor feasible, having a composition, which has been difficult to achieve by the previous growth method.

In yet another embodiment disclosed herein, the above III-V semiconductor alloy structure is formed with a monatomic layer which has neither N nor Al content and a composition of $Ga_yIn_{1-y}P$ ($0\leq y\leq1$), is interposed between first and second monatomic layers.

The first monatomic layer has an N content and a composition of $Ga_yIn_{1-y}N_zP_{1-z}$ ($0\leq y\leq1$ and $0<z<1$) and the second monatomic layer has no N content, an Al content and a composition of $(Al_xGa_{1-x})_yIn_{1-y}P$ ($0<x\leq1$ and $0<y\leq1$).

In this embodiment, the monatomic layer $Ga_yIn_{1-y}P$ ($0\leq y\leq1$) which has neither N nor Al content therein, is interposed between the first monatomic layer $Ga_yIn_{1-y}N_zP_{1-z}$ ($0\leq y\leq1$ and $0<z<1$) which has an N content, and the second monatomic layer $(Al_xGa_{1-x})_yIn_{1-y}P$ ($0<x\leq1$ and $0<y\leq1$) which has no N content and an Al content.

With this structure, a top layer can be formed to have no Al content with a $Ga_yIn_{1-y}N_zP_{1-z}$ ($0\leq y\leq1$ and $0<z<1$) layer prior to the growth of the second Al containing $(Al_xGa_{1-x})_yIn_{1-y}P$ layer. This facilitate the growth of the $Ga_yIn_{1-y}N_zP_{1-z}$ ($0\leq y\leq1$ and $0<z<1$) layer having an excellent crystallinity, thereby achieving also an improved crystallinity of the layers of $(Al_xGa_{1-x})_yIn_{1-y}N_zP_{1-z}$ ($0<x\leq1$, $0<y\leq1$ and $0<z<1$).

In another embodiment disclosed herein, light emitting devices are constructed, incorporating the above-mentioned III-V semiconductor alloy superlattice structure as an active layer.

As described earlier, since the III-V semiconductor alloy superlattice structure can be grown to have a composition which has been difficult to achieve by the previous growth method, and a conduction band discontinuity ($\Delta Ec$) may be increased for this structure.

Therefore, light emitting devices become feasible, such as red wavelength laser diodes having excellent temperature characteristics, visible wavelength laser diodes which may achieve emissions shorter wavelengths than 600 nm, visible region light emitting diodes having a high intensity, and also laser diodes for optical communication having excellent temperature characteristics.

EXAMPLES

The following examples are provided further to illustrate preferred embodiments disclosed herein.

Example 1

Figure 8:
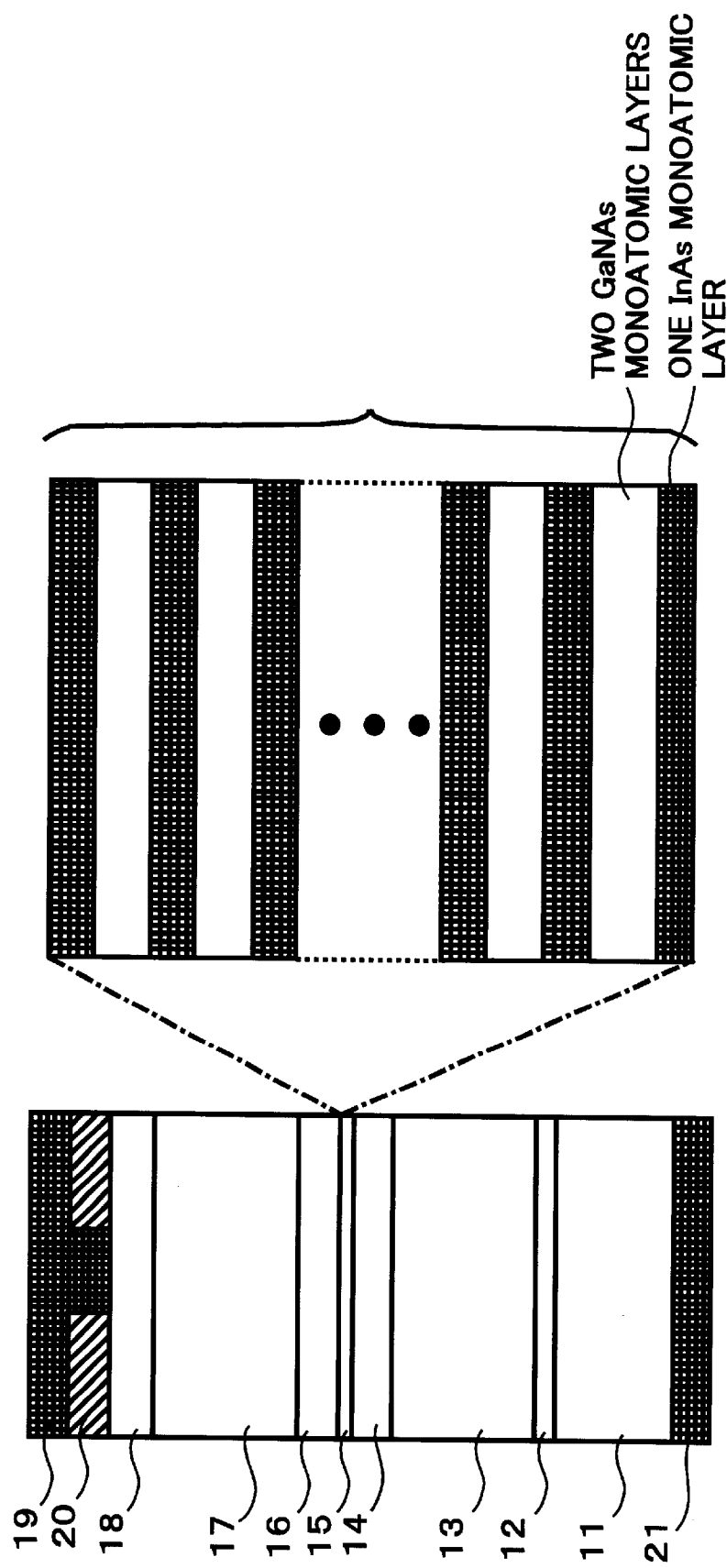
FIG. 8 is a cross section of a layered structure for forming a long wavelength laser comprising a GaInNAs quantum well structure deposited on a GaAs substrate.

A semiconductor layered structure according to the invention was fabricated as shown in FIG. 8, in which the layered structure was for forming a long wavelength laser comprising a GaInNAs quantum well structure deposited on a GaAs substrate.

In the description which follows, the case with a basic structure such as a dielectric-stripe laser having an SCH-SQW (separate confinement hetero-structure with a single quantum well) structure will be described.

The layered structures was grown by MOCVD, using source materials such as trimethylgallium (TMG), trimethylaluminum (TMA), trimethylindium (TMI), phosphine ($PH_3$), arsine ($AsH_3$) and dimethylhydrazine (DMHy), and hydrogen was used as a carrier gas.

Referring to FIG. 8, the layered structure comprises an n-GaAs substrate 11 with the following contiguous layers grown thereon, in the order recited:

An n-GaAs buffer layer 12, an n-$Ga_{0.5}In_{0.5}P$ lower cladding layer 13 having a thickness of 1.5 micron, an GaAs lower light guide layer 14 having a thickness of 100 nanometers, a quantum well layer 15 with a deduced average composition $Ga_{0.67}In_{0.33}N_{0.01}As_{0.99}$ having a thickness of 8 nanometers, a GaAs upper light guide layer 16 having a thickness of 100 nanometers, a p-$Al_{0.5}Ga_{0.5}P$ upper cladding layer 17 having a thickness of 1.5 micron, and a p-GaAs contact layer 18 having a thickness of 0.4 micron.

In addition, a dielectric layer 20 was disposed on the contact layer 18, a portion of which was removed to form a current inlet. Subsequently, a positive electrode 19 was provided in the removed portion on the contact layer 18, and a negative electrode 21 on the rear side of the GaAs substrate 11.

The quantum well layer 15 was formed with the following contiguous monatomic layers grown on the GaAs lower light guide layer 14 in the following order; a first InAs monatomic layer ($L_1$), a pair of second GaNAs monatomic layers ($2L_2$), another layer $L_1$, another pair of the layer $L_2$ ($2L_2$) and so on, each repeatedly formed to total 10 $L_1$ and 18 $L_2$ layers.

Since the layers $L_1$ and $L_2$ were formed as thin monatomic layers, the resultant quantum well layer 15 may be considered to be a single layer, having a deduced average composition of $Ga_{0.67}In_{0.33}N_{0.01}As_{0.99}$.

The rate of the N inclusion in the present GaInNAs alloy system increases with a decrease in the In composition as described earlier. Since the above quantum well layer 15 comprised GaNAs monatomic layers which had a higher rate of the N inclusion, an N composition was achieved which was higher than that in a single composition layer. Specifically, the desired semiconductor GaInNAs alloys with a higher N composition may be formed with more ease by utilizing, superlattice structures of compositional semiconductor layers such as GaNAs and other similar compounds.

Although the quantum well layer 15 was formed with InAs ($L_1$) and GaNAs ($L_2$) layers in the present embodiment, this layer may also be formed with the following two compositional layers: $Ga_{x1}In_{1-x1}N_yAs_{1-y}$ ($0<x1\leq1$ and $0<y<1$) which has a small In composition and N can be included, and $Ga_{x2}In_{1-x2}As$ ($0\leq x2<x1\leq1$) which has a large In composition and N is not included. With these compositional layers, a resultant layered structure becomes feasible having a higher elemental composition which has been difficult to achieve by the previous growth method having a single composition throughout the layer.

The thus formed semiconductor structure was then subjected to several evaluation measurements. The results from the measurements showed the structure had light emissions at a wavelength of approximately 1.3 micron and a threshold current value lower than that for the single composition layer.

Example 2

Figure 9:
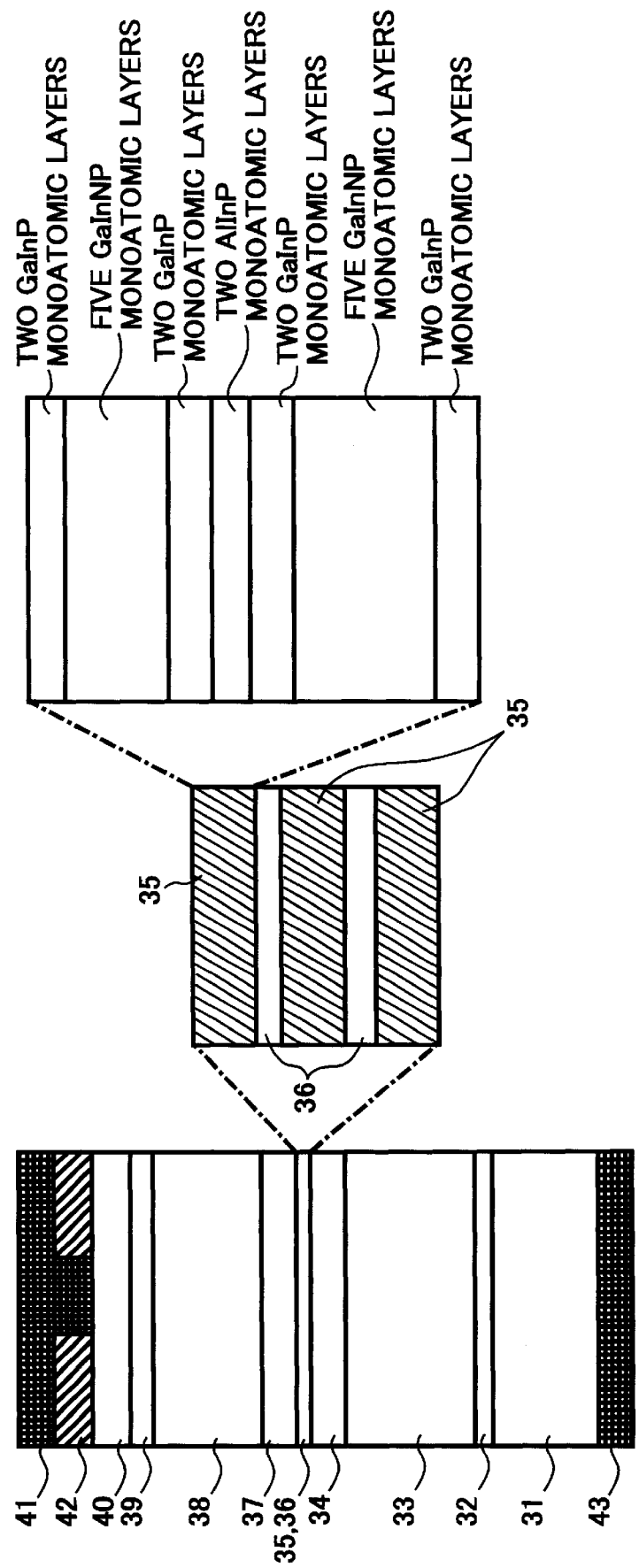
FIG. 9 is a cross section of a layered structure for forming a semiconductor laser having short wavelength laser, comprising an AlGaInNP quantum well structure formed on a GaAs substrate.

A light emitting semiconductor device according to the invention was constructed as shown in FIG. 9, in which the device was a semiconductor laser having shorter (or visible) wavelength region emissions, comprising an AlGaInNP quantum well structure formed on a GaAs substrate.

In the description which follows, there will be detailed the case with a basic structure used for forming a dielectric-stripe laser having an SCH-MQW (separate confinement hetero-structure with a multiple quantum well) structure for the purpose of example.

The laser device was grown by MOCVD using source materials such as TMA, TMG, TMI, $PH_3$, $AsH_3$ and DMHy, and hydrogen as the carrier gas.

Referring to the FIG. 9, the semiconductor laser comprised an n-GaAs substrate 31 with the following contiguous layers grown thereon, in the order recited:

An n-GaAs buffer layer 32, an n-$(Al_{0.7}Ga_{0.3})_{0.5}In_{0.5}P$ lower cladding layer 33 having a thickness of 1.0 micron, an $(Al_{0.5}Ga_{0.5})_{0.5}In_{0.5}P$ lower light guide layer 34 having a thickness of 50 nanometers, an active layer or active region, comprising $(Al_{0.1}Ga_{0.9})_{0.5}In_{0.5}N_{0.005}P_{0.995}$ quantum well layers 35, which are lattice-matched to the GaAs substrate 31, having a thickness of 5 nanometers, $(Al_{0.5}Ga_{0.5})_{0.5}In_{0.5}P$ barrier layers 36 having a thickness of 8 nanometers, $(Al_{0.1}Ga_{0.9})_{0.5}In_{0.5}N_{0.0005}P_{0.995}$ quantum well layers 35, having a thickness of 5 nanometers, $(Al_{0.5}Ga_{0.5})_{0.5}In_{0.5}P$ barrier layers 36 having a thickness of 8 nanometers, and $(Al_{0.1}Ga_{0.9})_{0.5}In_{0.5}N_{0.005}P_{0.995}$ quantum well layers 35, having a thickness of 5 nanometers;

an $(Al_{0.5}Ga_{0.5})_{0.5}In_{0.5}P$ upper light guide layer 37 having a thickness of 50 nanometers, a p-$(Al_{0.7}Ga_{0.3})_{0.5}In_{0.5}P$ upper cladding layer 38 having a thickness of 1.0 micron, a p-$Ga_{0.5}In_{0.5}P$ capping layer 39 having with a thickness of 0.1 micron, and a p-GaAs contact layer 40 having a thickness of 0.4 micron.

In addition a dielectric layer 42 was disposed on the contact layer 40, a portion of which was removed to form a current inlet. Subsequently, a positive electrode 41 was provided in the removed portion on the contact layer 40, and a negative electrode 43 on the rear side of the GaAs substrate 31.

The above quantum well layer 35 was formed as a superlattice structure with the following contiguous monatomic layers grown on the $(Al_{0.5}Ga_{0.5})_{0.5}In_{0.5}P$ lower light guide layer 34 in the following order:

approximately two $Ga_{0.5}In_{0.5}P$ monatomic layers, approximately five $Ga_{0.5}In_{0.5}N_{0.01}P_{0.99}$ monatomic layers, approximately two $Ga_{0.5}In_{0.5}P$ monatomic layers, approximately two $Al_{0.5}In_{0.5}P$ monatomic layers, approximately two $Ga_{0.5}In_{0.5}P$ monatomic layers, approximately five $Ga_{0.5}In_{0.5}N_{0.01}P_{0.99}$ monatomic layers, and approximately two $Ga_{0.5}In_{0.5}P$ monatomic layers.

The above layers were formed of thin monatomic layers, the resultant quantum well layer 35 may be considered to be a single alloy layer, having a deduced average composition of $(Al_{0.1}Ga_{0.9})_{0.5}In_{0.5}N_{0.005}P_{0.995}$.

Since the N inclusion was carried out in a ternary alloy GaInP which did not include Al therein, but not in a quaternary alloy AlGaInP which included Al therein, a larger crystallinity value was achieved in the thus formed structure. The N addition is known to decrease the energy values of both conduction and valence bands, while the band gap energy is decreased to a certain extent. In addition, since AlGaInP layers, having a relatively wide band gap energy, are included in the structure, the above-mentioned decrease in the band gap energy can be compensated.

Furthermore, since an N containing layer and an Al containing layer are not in direct contact with each other, but interposed by a GaInP layer which include neither N nor Al therein, a decrease in crystallinity in the GaInNP layers can be prevented.

With these compositional layers, a resultant layered structure becomes feasible, having a higher elemental composition and crystallinity. This has been difficult to achieve by the previous growth methods, in which layers have generally been grown having a single composition throughout the layers. In addition, since the N addition decreases the energy values of both conduction and valence bands, and the band gap energy, a larger amount of the band discontinuity (ΔEc) can be attained for forming the light guide layer.

The thus formed semiconductor laser of FIG. 9 was then subjected to several evaluation measurements. The results from the measurements showed the laser device had excellent temperature characteristics.

Example 3

Figure 10:
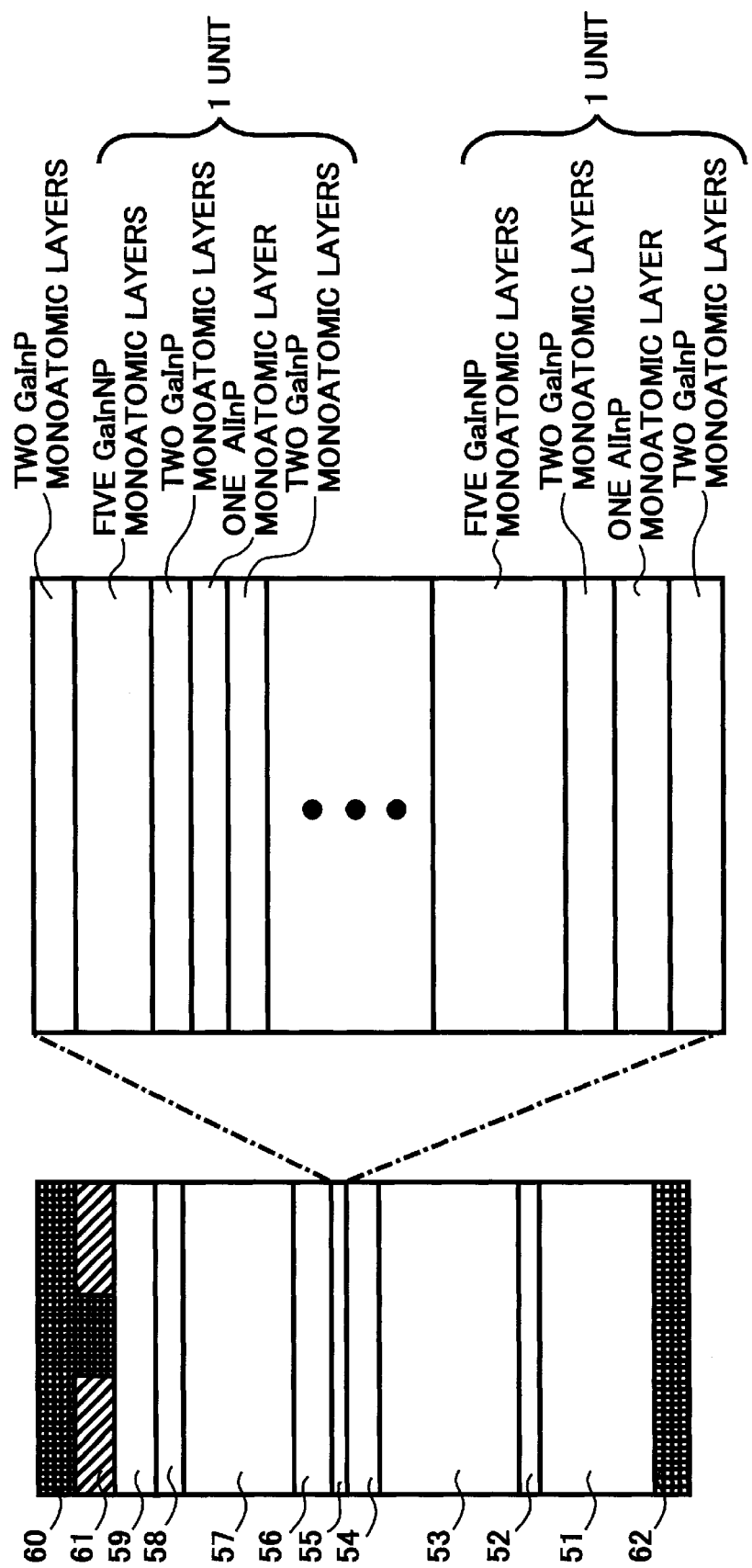
FIG. 10 is a cross section of another layered structure for forming a semiconductor laser having short wavelength laser, comprising an AlGaInNP quantum well structure formed on a GaAs substrate.

A light emitting semiconductor device according to the invention was constructed as shown in FIG. 10, in which the device was a semiconductor laser having shorter (or visible) wavelength region emissions, comprising an AlGaInNP quantum well structure formed on a GaAs substrate.

The AlGaInNP structure has a lattice constant smaller than that of GaAs, thereby being tensively strained. When the AlGaInP composition approach to AlGaP, the lattice constant thereof is known and the band gap energy increased to thereby facilitate light emission at shorter wavelength region.

In the description which follows, there will be detailed the case with a basic structure used for forming a dielectric-stripe laser having an SCH-SQW structure.

The laser device was grown by MOCVD using source materials such as TMA, TMG, TMI, $PH_3$, $AsH_3$ and DMHy, and hydrogen as the carrier gas.

Referring to the FIG. 10, the semiconductor laser comprised an n-GaAs substrate 51 with the following contiguous layers grown thereon, in the order recited:

An n-GaAs buffer layer 52, an n-$(Al_{0.7}Ga_{0.3})_{0.5}In_{0.5}P$ lower cladding layer 53 having a thickness of 1.0 micron, an $(Al_{0.5}Ga_{0.5})_{0.5}In_{0.5}P$ lower light guide layer 54 having a thickness of 50 nanometers, $(Al_{0.1}Ga_{0.9})_{0.65}In_{0.35}N_{0.005}P_{0.995}$ quantum well layers 55, having a lattice constant larger than that of GaAs substrate 51, an $(Al_{0.5}Ga_{0.5})_{0.5}In_{0.5}P$ upper light guide layer 56 having a thickness of 50 nanometers, a p-$(Al_{0.7}Ga_{0.3})_{0.5}In_{0.5}P$ upper cladding layer 57 having a thickness of 1.0 micron, a p-$Ga_{0.5}In_{0.5}P$ capping layer 58 having with a thickness of 0.1 micron, and a p-GaAs contact layer 59 having a thickness of 0.4 micron.

In addition, a dielectric layer 61 was disposed on the contact layer 59, a portion of which was removed to form a current inlet. Subsequently, a positive electrode 60 was provided in the removed portion on the contact layer 59, and a negative electrode 62 on the rear side of the GaAs substrate 51.

The aforementioned quantum well layer 55 was formed with seven units of monatomic layers consecutively grown on the $(Al_{0.5}Ga_{0.5})_{0.5}In_{0.5}P$ lower light guide layer 54, in which the units was each grown with the following layers, in the order recited from bottom:

Approximately two $Ga_{0.65}In_{0.35}P$ monatomic layers,
approximately one $Al_{0.65}In_{0.35}P$ monatomic layer,
approximately two $Ga_{0.65}In_{0.35}P$ monatomic layers, and
approximately five $Ga_{0.65}In_{0.35}N_{0.01}P_{0.99}$ monatomic layers In addition, approximately two $Ga_{0.65}In_{0.35}P$ monatomic layers were formed further thereon.

The above monatomic layers were each formed of thin monatomic layers, the resultant quantum well layer 55 may be considered to be a single alloy layer, having a deduced average composition of $(Al_{0.1}Ga_{0.9})_{0.65}In_{0.35}N_{0.005}P_{0.995}$.

Since the N inclusion was carried out in a ternary alloy GaInP which did not include Al therein, but not in a quaternary alloy AlGaInP which included Al therein, a larger crystallinity value was achieved in the thus formed structure. As aforementioned, the N addition is known to decrease the energy values of both conduction and valence bands, while the band gap energy is decreased to a certain extent. In addition, since AlGaInP layers, having a relatively wide band gap energy, are included in the structure, the above-mentioned decrease in the band gap energy can be compensated.

Furthermore, since an N containing layer and an Al containing layer are not in direct contact with each other, but interposed by a GaInP layer which include neither N nor Al therein, a decrease in crystallinity in the GaInNP layers can be prevented.

With these compositional layers, a resultant layered structure becomes feasible, having a higher elemental composition and crystallinity. This has been difficult to achieve by the previous growth methods, in which layers have generally be grown having a single composition throughout the layers. In addition, since the N addition decreases the energy values of both conduction and valence bands, and the band gap energy, a larger amount of the band discontinuity ($\Delta Ec$) can be attained for the light guide layer.

The thus formed semiconductor laser of FIG. 10 was then subjected to several evaluation measurements. The results from the measurements indicated that the laser device had visible range laser emissions at 630 nm and excellent temperature characteristics.

As described hereinabove, the above III-V semiconductor alloy structure is formed with first and second monatomic layers, in which the first monatomic layers $Ga_yIn_{1-y}N_zP_{1-z}$ ($0 \leq y \leq 1$ and $0 < z < 1$) are able to include N with more case and the second monatomic layers $(Al_xGa_{1-x})_yIn_{1-y}P$ ($0 < x \leq 1$ and $0 < y \leq 1$) have no N content and an Al content which may impart a wide band gap energy. Further, the N containing layer and Al containing layer are not in direct contact with each other, but interposed preferably by a layer such as, for example, GaInP which include neither N nor Al therein.

Although the III-V semiconductor allow structures have been described specifically with the above-mentioned compositions and their layered structures, it is to be understood that other compositions and layered structures may also be used to provide such structures as having similar characteristics.

For example, other semiconductor alloys, including N and another group-V element, and more than one group-III elements may well be used to give rise to desirable semiconductor properties. In addition, light emitting devices disclosed herein may also be constructed as semiconductor laser diodes in use for optical communication and laser diodes for optical printing systems, as well as light emitting diodes and infrared photo-diodes.

According to one aspect of the invention, a III-V semiconductor alloy layered structure is provided, which comprises first and second monatomic layers. The first monatomic layer includes a III-V semiconductor alloy containing N, at least one other group-V element, and at least one group-III element; and the second monatomic layer includes a III-V semiconductor alloy containing no N and at least one group-V element excepting N, and at least one group-III element. Through the deposition of the first and second monatomic layers in a predetermined order, the III-V semiconductor alloy structure is formed as a superlattice structure having a deduced average composition.

Specifically, since the superlattice structure is formed with a plurality of III-V semiconductor layers and these constituent layers are each formed as thin monatomic layers, the resultant superlattice structure may be considered to be a single semiconductor layer, having a deduced average composition, resulting in the same band gap energy as that of the compound semiconductor having the same composition.

In addition, since the N addition is carried out to the layers for which the N addition can be made with more ease, and these layers are disposed in a predetermined order with layers which have no N content, a resultant layered structure becomes feasible to have a higher elemental composition which has been difficult to achieve by the previous growth method.

According to another aspect of the invention, the above III-V semiconductor alloy structure is formed with first and second monatomic layers so as to have a reduced composition of $Ga_xIn_{1-x}N_yAs_{1-y}$, where $0 < x < 1$ and $0 < y < 1$.

The first monatomic layer has an N content and a composition of $Ga_{x1}In_{1-x1}N_yAs_{1-y}$, where $0 < x1 \leq 1$ and $0 < y < 1$, and second monatomic layer has no N content and has a composition of $Ga_{x2}In_{1-x2}As$, where $0 \leq x2 < x1 \leq 1$, respectively. In addition, at least one each of the first and second monatomic layers is deposited in a predetermined order to form the III-V semiconductor alloy structure as a superlattice structure.

Since the superlattice structure of this embodiment is formed with a plurality of III-V semiconductor layers and these constituent layers are each formed as thin monatomic layers, the resultant superlattice structure may be considered to be a single layer, having the deduced average composition $Ga_xIn_{1-x}N_yAs_{1-y}$, This results in the same band gap energy as that of the compound semiconductor having the same composition.

In addition, since the N addition is carried out to the layers which have no or minimal In content and can include N with more ease, the resultant layered structure can be formed with an N content higher than that in previous layers, having a single composition of a group-III element such as In, for example, throughout the layer thickness. Therefore, the overall efficiency of the N inclusion is increased, facilitating the formation of GaInNAs layers having an excellent crystallinity.

According to another aspect of the invention, the above III-V semiconductor alloy structure is formed with first and second monatomic layers so as to have a reduced composition of $(Al_xGa_{1-x})_yIn_{1-y}N_zP_{1-z}$, where $0 < x \leq 1$, $0 < y \leq 1$ and $0 < z < 1$.

The first monatomic layer has an N content, no Al content and a composition of $Ga_yIn_{1-y}N_zP_{1-z}$, where $0 \leq y \leq 1$ and $0 < z < 1$, and second monatomic layer has no N content, an Al content and a composition of $(Al_xGa_{1-x})_yIn_{1-y}P$, where $0<x\leq1$, and $0<y\leq1$, respectively. In addition, at least one each of the first and second monatomic layers is deposited in a predetermined order to form the III-V semiconductor alloy structure as a superlattice structure.

Since the superlattice structure is formed with a plurality of III-V semiconductor layers and these constituent layers are each formed as thin monatomic layers, the resultant superlattice structure may be considered to be a single layer, having the deduced average composition $(Al_xGa_{1-x})_yIn_{1-y}N_zP_{1-z}$. This results in the same band gap energy as that of the compound semiconductor having the same composition.

In this embodiment, the first monatomic layers $Ga_yIn_{1-y}N_zP_{1-z}$, ($0\leq y\leq1$ and $0<z<1$) are able to include N with more ease, and the second monatomic layers $(Al_xGa_{1-x})_yIn_{1-y}P$ ($0<x\leq1$ and $0<y\leq1$) have no N content and an Al content which may impart a wide band gap energy. These first and second monatomic layers are disposed in a predetermined order so as to have the superlattice structure having the reduced composition $(Al_xGa_{1-x})_yIn_{1-y}N_zP_{1-z}$ ($0<x\leq1$, $0<y\leq1$ and $0<z<1$).

With this structure, a larger conduction band discontinuity ($\Delta Ec$) by addition of N to $Ga_yIn_{1-y}N_zP_{1-y}$ ($0\leq y\leq1$ and $0<z<1$) is attained and the decrease in the band gap energy caused by the N addition is compensated with the Al containing $(Al_xGa_{1-x})_yIn_{1-y}P$ ($0<x\leq1$ and $0<y\leq1$) layers.

This makes an alloy semiconductor feasible, having a composition, which has been difficult to achieve by the previous growth method.

According to another aspect of the invention, the above III-V semiconductor alloy structure further comprises a monatomic layer which includes neither N nor Al content and a composition of $Ga_yIn_{1-y}P$ ($0\leq y\leq1$), and which is interposed between first and second monatomic layers.

The first monatomic layer has an N content and a composition of $Ga_yIn_{1-y}N_zP_{1-z}$ ($0\leq y\leq1$ and $0<z<1$) and the second monatomic layer has no N content, an Al content and a composition of $(Al_xGa_{1-x})_yIn_{1-y}P$ ($0<x$ 1 and $0<y$ 1).

With this structure, a top layer can be formed to have no Al content with a $Ga_yIn_{1-y}N_zP_{1-z}$ ($0\leq y\leq1$ and $0<z<1$) layer prior to the growth of the second Al containing $(Al_xGa_{1-x})_yIn_{1-x}P$ layer. This facilitate the growth of the $Ga_yIn_{1-y}N_zP_{1-z}$ ($0\leq y\leq1$ and $0<z<1$) layer having an excellent crystallinity, thereby achieving also an improved crystallinity in the layers of $(Al_xGa_{1-x})_yIn_{1-y}N_zP_{1-z}$ ($0<x\leq1$, $0<y\leq1$ and $0<z<1$).

According to another aspect of the invention, light emitting devices are constructed, which incorporates the above-mentioned III-V semiconductor layered structure as an active layer, and in which the layered structure as described above.

As described earlier, since the III-V semiconductor layered structure can be grown to have a composition which has been difficult to achieve by the previous growth method, and a conduction band discontinuity ($\Delta Ec$) may be increased for this structure.

Therefore, light emitting devices can be provided with the active layer of the present invention, such as red wavelength laser diodes having excellent temperature characteristics, visible wavelength laser diodes which may achieve emissions shorter wavelengths than 600 nm, visible region light emitting diodes having a high intensity, and also laser diodes for optical communication having excellent temperature characteristics.

The entire disclosures of Japanese Applications Nos. 09-350071 and 10-156713, filed Dec. 4, 1997 and May 21, 1998, respectively, are incorporated herein by reference.

The above description and drawings illustrate preferred embodiments which achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A III-V semiconductor alloy structure, said structure comprising:

first and second monatomic layers, wherein said first monatomic layer includes a III-V semiconductor alloy containing N, at least one other group-V element, and at least one group-III element, wherein said second monatomic layer includes a III-V semiconductor alloy containing no N, at least one group-V element excepting N, and In as at least one group-III element, wherein if said first monatomic layer also contains In, it is of a lower content as compared with the content of In in said second monatomic layer; and a superlattice structure formed from the deposition of said first and second monatomic layers in a predetermined order.

2. The III-V semiconductor alloy structure of claim 1, wherein said III-V semiconductor alloy structure has a reduced composition of $Ga_xIn_{1-x}N_yAs_{1-y}$, where $0<x<1$ and $0<y<1$, and wherein said first monatomic layer contains N and has a composition of $Ga_{x1}In_{1-x1}N_yAs_{1-y}$, where $0<x1\leq1$ and $0<y<1$, and said second monatomic layer does not contain N and has a composition of $Ga_{x2}In_{1-x2}As$, where $0\leq x2<x1\leq1$, and wherein at least one each of said first and second monatomic layers is deposited in a predetermined order to form said superlattice structure.

3. The III-V semiconductor alloy structure of claim 1, wherein said III-V semiconductor alloy structure has a reduced composition of $(Al_xGa_{1-x})_yIn_{1-y}N_zP_{1-z}$, where $0<x\leq1$, $0<y\leq1$ and $0<z<1$, and wherein said first monatomic layer contains N, does not contain Al and has a composition of $Ga_yIn_{1-y}N_zP_{1-z}$, where $0\leq y\leq1$ and $0<z<1$, and said second monatomic layer has no N content, contains Al and has a composition of $(Al_xGa_{1-x})_yIn_{1-y}P$, where $0<x\leq1$, and $0<y\leq1$, and wherein at least one each of said first and second monatomic layers is deposited in a predetermined order to form said superlattice structure.

4. The III-V semiconductor alloy structure of claim 3, further comprising an interposed monatomic layer which does not contain N or Al, and having a composition of $Ga_yIn_{1-y}P$, where $0\leq y\leq1$, said interposed monatomic layer interposed between said first monatomic layer and said second moniatomic layer, wherein at least one each of said first, second, and interposed $Ga_yIn_{1-y}P$ monatomic layers is deposited in a predetermined order to form said superlattice structure.

5. A light emitting semiconductor device, said device comprising:

an active layer, said active layer further comprising a layered structure of a group III-V semiconductor alloy; and a plurality of monatomic layers within said active layer, wherein said layered structure is as claimed in claim 1.

6. A light emitting semiconductor device, said device comprising:

an active layer, said active layer further comprising a layered structure of a group III-V semiconductor alloy; and a plurality of monatomic layers within said active layer, wherein said layered structure is as claimed in claim 2.

7. A light emitting semiconductor device, said device comprising:

an active layer, said active layer further comprising a layered structure of a group III-V semiconductor alloy; and a plurality of monatomic layers within said active layer, wherein said layered structure is as claimed in claim 3.

8. A light emitting semiconductor device, said device comprising:

an active layer, said active layer further comprising a layered structure of a group III-V semiconductor alloy; and a plurality of monatomic layers within said active layer, wherein said layered structure is as claimed in claim 4.

9. A III-V semiconductor alloy structure, said structure comprising:

first and second monatomic layers, wherein said first monatomic layer includes a III-V semiconductor alloy containing N, at least one other group-V element, and at least one group-III element, wherein said second monatomic layer includes a III-V semiconductor alloy containing no N, at least one group-V element excepting N, and In as at least one group-III element, wherein if said first monatomic layer also contains In, it is of a lower content as compared with the content of In in said second monatomic layer, and wherein the first and second monatomic layers are formed by a metal organic chemical vapor deposition (MOCVD) method using an organic metal as a source material for the group III element and an organic nitrogen compound as a source material for nitrogen; and a superlattice structure formed from the deposition of said first and second monatomic layers in a predetermined order.

10. The III-V semiconductor alloy structure of claim 9, wherein said III-V semiconductor alloy structure has a reduced composition of $Ga_xIn_{1-x}N_yAs_{1-y}$, where $0<x<1$ and $0<y<1$, and wherein said first monatomic layer contains N and has a composition of $Ga_{x1}In_{1-x1}N_yAs_{1-y}$, where $0<x1\leq1$ and $0<y<1$, and said second monatomic layer does not contain N and has a composition of $Ga_{x2}In_{1-x2}As$, where $0\leq x2<x1\leq1$, and wherein at least one each of said first and second monatomic layers is deposited in a predetermined order to form said superlattice structure.

11. The III-V semiconductor alloy structure of claim 9, wherein said III-V semiconductor alloy structure has a reduced composition of $(Al_xGa_{1-x})_yIn_{1-y}N_zP_{1-z}$, where $0<x\leq1$, $0<y\leq1$ and $0<z<1$, and wherein said first monatomic layer contains N, does not contain Al and has a composition of $Ga_yIn_{1-y}N_zP_{1-z}$, where $0\leq y\leq1$ and $0<z<1$, and said second monatomic layer has no N content, contains Al and has a composition of $(Al_xGa_{1-x})_yIn_{1-y}P$, where $0<x\leq1$, and $0<y\leq1$, and wherein at least one each of said first and second monatomic layers is deposited in a predetermined order to form said superlattice structure.

12. The III-V semiconductor alloy structure of claim 11, further comprising an interposed monatomic layer which does not contain N or Al, and having a composition of $Ga_yIn_{1-y}P$, where $0\leq y\leq1$, said interposed monatomic layer interposed between said first monatomic layer and said second monatomic layer, wherein at least one each of said first, second, and interposed $Ga_yIn_{1-y}P$ monatomic layers is deposited in a predetermined order to form said superlattice structure.

13. A light emitting semiconductor device, said device comprising:

an active layer, said active layer further comprising a layered structure of a group III-V semiconductor alloy; and a plurality of monatomic layers within said active layer, wherein said layered structure is as claimed in claim 9.

14. A light emitting semiconductor device, said device comprising:

an active layer, said active layer further comprising a layered structure of a group III-V semiconductor alloy; and a plurality of monatomic layers within said active layer, wherein said layered structure is as claimed in claim 10.

15. A light emitting semiconductor device, said device comprising:

an active layer, said active layer further comprising a layered structure of a group III-V semiconductor alloy; and a plurality of monatomic layers within said active layer, wherein said layered structure is as claimed in claim 11.

16. A light emitting semiconductor device, said device comprising:

an active layer, said active layer further comprising a layered structure of a group III-V semiconductor alloy; and a plurality of monatomic layers within said active layer, wherein said layered structure is as claimed in claim 12.

* * * * *